United States Patent
Mancini et al.

(10) Patent No.: US 7,311,979 B2
(45) Date of Patent: Dec. 25, 2007

(54) METHOD AND COATING SYSTEM FOR REDUCING CARBONACEOUS DEPOSITS ON SURFACES EXPOSED TO HYDROCARBON FUELS AT ELEVATED TEMPERATURES

(75) Inventors: Alfred Albert Mancini, Cincinnati, OH (US); John Frederick Ackerman, Laramie, WY (US); Kevin Richard Leamy, Loveland, OH (US); William Randolph Stowell, Rising Sun, IN (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/711,403

(22) Filed: Sep. 16, 2004

(65) Prior Publication Data

US 2005/0019593 A1 Jan. 27, 2005

Related U.S. Application Data

(63) Continuation-in-part of application No. 10/065,054, filed on Sep. 13, 2002, now Pat. No. 6,808,816.

(51) Int. Cl.
*B32B 15/04* (2006.01)
*B32B 18/00* (2006.01)

(52) U.S. Cl. ............... 428/448; 428/450; 428/469; 428/701; 428/699; 428/632; 416/241 R; 416/241 B; 422/241

(58) Field of Classification Search ............ 416/241 B, 416/241 R; 428/446, 448, 450, 469, 472, 428/670, 697, 699, 701, 702, 632; 422/241
See application file for complete search history.

(56) References Cited

U.S. PATENT DOCUMENTS

| | | | | |
|---|---|---|---|---|
| 5,545,437 | A | * 8/1996 | Nagaraj et al. | ............ 427/404 |
| 5,565,393 | A | 10/1996 | Felix et al. | ................ 502/210 |
| 5,891,584 | A | * 4/1999 | Coffinberry | ................ 428/552 |
| 6,119,485 | A | 9/2000 | Hibino et al. | ................ 65/305 |
| 2003/0157265 | A1 | 8/2003 | Furuya et al. | ............ 427/444 |

FOREIGN PATENT DOCUMENTS

EP 304176 A2 * 2/1989
JP 56030514 A * 3/1981

* cited by examiner

*Primary Examiner*—John J. Zimmerman
*Assistant Examiner*—Aaron Austin
(74) *Attorney, Agent, or Firm*—William Scott Andes; Gary M. Hartman; Domenica N. S. Hartman

(57) ABSTRACT

A coating system and method for reducing the tendency for hydrocarbon fluids, such as fuels and oils, to form carbonaceous deposits that adhere to a wall of a containment article. Of particular concern are carbonaceous deposits that form at temperatures below about 650° F. (about 345° C.). The coating system combines an outermost layer of platinum with a ceramic barrier layer. The coating system significantly reduces the formation of carbonaceous deposits and the adhesion of such deposits. To further reduce wall and hydrocarbon fluid temperatures and formation of carbonaceous deposits, the coating system is preferably applied to the surface of the wall wetted by the fluid, as well as the opposite surface of the wall exposed to a surrounding environment. The outermost layers serve as radiation shields to reduce heat transfer from the surrounding environment to the wall, and from the wall to the hydrocarbon fluid.

18 Claims, 3 Drawing Sheets

METHOD AND COATING SYSTEM FOR REDUCING CARBONACEOUS DEPOSITS ON SURFACES EXPOSED TO HYDROCARBON FUELS AT ELEVATED TEMPERATURES

CROSS REFERENCE TO RELATED APPLICATIONS

This is a continuation-in-part patent application of U.S. patent application Ser. No. 10/065,054, filed Sep. 13, 2002, now U.S. Pat. No. 6,808,816.

BACKGROUND OF THE INVENTION

The present invention relates to coatings that inhibit the formation and adhesion of deposits on surfaces that contact hydrocarbon fluids. More particularly, this invention relates to a method and coating system for preventing or reducing the deposition of carbonaceous deposits on surfaces that contact a hydrocarbon fluid at high temperatures.

Thermal instability, or in the case of fuels, fuel instability, generally refers to the formation of undesired deposits that occurs when hydrocarbon fluids, such as fuels and lubricating oils, are at high temperatures, generally above about 140° C. In the case of fuels, it is generally accepted that there are two distinct mechanisms occurring within two overlapping temperature ranges. In the first mechanism, referred to as the coking process, a generally consistent increase in the rate of formation of coke deposits occurs above temperatures of about 650° F. (about 345° C.). Coke formation is the result of high levels of hydrocarbon pyrolysis, and eventually limits the usefulness of the fuel. A second mechanism primarily occurs at lower temperatures, generally in the range of about 220° F. to about 650° F. (about 105° C. to about 345° C.), and involves oxidation reactions that lead to polymerization and carbonaceous gum deposits.

In the past, the solution to the problem of gum and coke formation was primarily directed toward placing limitations on fuel chemistry and impurities associated with fuels, as disclosed in U.S. Pat. Nos. 2,698,512, 2,959,915 and 3,173,247. However, the propensity for gum and coke formation is increased with certain hydrocarbon fluids for fuels, oils, lubricants, petrochemical processes (plastics and synthetics) and the like, especially those derived from nonpetroleum sources, such as shale and coal, which can exhibit significantly more problems with thermal instability because of their high content of olefins, sulfur and other compounds. The consequences of thermal instability and fuel instability are of even greater significance with developing technology that requires processes and machinery to operate at higher temperatures, as afforded by advances in materials technology. Accordingly, fluid containment articles that are resistant to or prevent the formation of adverse decomposition products and foulants are necessary in applications where thermal instability, including fuel instability, is a problem as a result of exposure to such fluids to high temperatures. Particularly notable applications include the fuel-handling and hydraulic components of gas turbine engines. With the advent of higher engine operation temperatures and the use of fuel as a heat sink, there is an increased likelihood that fluid flow through such components will be restricted or even blocked by carbonaceous deposits.

It has been recognized that deposits can form as a result of a reaction between a hydrocarbon fluid and its containment wall. In U.S. Pat. No. 4,078,604, heat exchangers are provided with thin-walled corrosion-resistant layers of electrodeposited gold or similar corrosion-resistant metals on the walls of the cooling channels in order to make the surfaces corrosion resistant to such storable liquid fuels as red fuming nitric acid. In this case, the wall is protected from corrosion, and the intent is not to prevent deposit formations. Furthermore, gold readily diffuses into other materials at elevated temperatures, and therefore is unsuitable as a protective coating for high temperature applications, e.g., temperatures associated with gum and coke formation.

More recently, coating systems specifically directed to inhibiting the formation and adhesion of carbonaceous deposits have been taught. For example, U.S. Pat. Nos. 5,805,973, 5,891,584 and 5,923,944 and U.S. patent application Ser. No. 09/955,043, all assigned to the assignee of the present invention and incorporated herein by reference, teach the use of coke barrier coatings (CBC's) that eliminate or modify the surface reactions which lead to formation of thermal instability deposits from hydrocarbon fluids, and reduce adhesion of such deposits. These patents are generally directed to ceramic coatings that are especially capable of reducing deposits at very high temperatures, e.g., above 650° F. (about 345° C.). As an example, U.S. Pat. Nos. 5,805,973 and 5,891,584 disclose coatings that catalyze thermal decomposition in the hydrocarbon fluid to actually promote the formation of coke, which is substantially nonadherent to the coatings.

Many applications exist where there is a particular need for coatings that can significantly reduce the formation and adhesion of carbonaceous deposits at lower temperatures, such as fuel/air heat exchangers, fuel nozzles, oil sumps and other fuel and hydraulic system components of gas turbine engines. For this type of hardware, reductions in hydrocarbon deposits have been achieved with the use of coatings that are not reactive with hydrocarbons. In situations where heat transfer from the containment walls is a major contributor to the fluid temperature, thermally-reflective (low emissivity) coatings that reduce heat transfer to the hydrocarbon fluid have been employed to reduce deposit formation. Notably, the CBC systems taught by U.S. Pat. Nos. 5,805,973, 5,891,584 and 5,923,944 and U.S. patent application Ser. No. 09/955,043 do not have the correct optical properties, including low emissivity, to function as radiation shields. While CBC systems of the prior art can be combined with low-emissivity coatings, a significant drawback is the additional volume, weight and cost incurred. Accordingly, it would be desirable if an improved coating system were available that reduced the formation of carbonaceous deposits in hydrocarbon fluids at temperatures below about 650° F., reduced the adhesion of such deposits, and reduced the temperature of the hydrocarbon fluids.

BRIEF SUMMARY OF THE INVENTION

The present invention provides a coating system and method for reducing the tendency for hydrocarbon fluids, such as fuels and oils, to form carbonaceous deposits that adhere to their containment surfaces. The invention is particularly concerned with the carbonaceous deposits that form at temperatures below about 650° F. (about 345° C.). According to the invention, a coating system that combines an outermost layer of platinum with a ceramic barrier layer has been shown to significantly reduce the formation of carbonaceous deposits at temperatures between about 220° F. and 650° F. (about 105° C. to about 345° C.), as well as reduce the adhesion of such deposits. For applications where there is heat transfer from/to the hydrocarbon fluid through a containment wall to its environment or a second fluid, it is desirable to reduce the heat transfer and thus reduce the hydrocarbon-wetted surface temperature to further reduce deposition rates. In such applications, the platinum outermost layer can also serve as a radiation shield to reduce heat transfer from the containment wall to the hydrocarbon fluid. The platinum outermost layer is preferably deposited as an extremely thin film by chemical vapor deposition, while the ceramic barrier layer is deposited to a thickness sufficient to prevent interdiffusion of the platinum outermost layer with the containment wall on which the coating system is deposited.

According to a preferred aspect of the invention, heat transfer through the containment wall is inhibited by applying the coating system to opposite surfaces of the wall. Heat transfer through the wall may be from a hot environment (e.g., a second fluid) to a cooler hydrocarbon fluid, or from a hot hydrocarbon fluid to a cooler environment (e.g., a second fluid). The containment wall may be a wall of a conduit within the environment and through which the hydrocarbon fluid flows, or a wall of a conduit surrounded by the hydrocarbon fluid and through which a second fluid flows, as in a two-fluid heat exchanger. The coating system may be applied to the hydrocarbon-wetted surface and to the opposite surface of the conduit during the same coating application processes. For the case of a cool hydrocarbon in a hot environment, applying the coating system to both surfaces of the wall results in more radiation being reflected back to the environment surrounding the conduit, thereby reducing the temperature of the hydrocarbon-wetted surface. Also, less radiation is emitted to the hydrocarbon fluid, reducing the temperature rise of the hydrocarbon fluid and thereby reducing deposition rate of carbonaceous deposits. For the case of a heat transfer from a hot hydrocarbon fluid to a cooler environment surrounding the containment wall, the coating system is preferably applied only to the hydrocarbon-wetted surface of the wall, such that radiation is reflected back to the hydrocarbon fluid and more easily emitted to the environment, again reducing the wall temperature.

From the above, it can be seen that the coating system of this invention can be present as a very thin coating, yet performs multiple distinct functions that reduce hydrocarbon fluid deposits at temperatures below about 650° F. First, a platinum outermost layer on a hydrocarbon-wetted surface reduces deposition for a given temperature. Second, if a hydrocarbon fluid is subject to heating by its environment (such as a second fluid), a platinum outermost layer on the surface of the wall opposite the hydrocarbon fluid serves to reflect radiant energy back to the environment, thereby reducing the hydrocarbon-wetted surface temperature and consequently further reducing deposition rates. Third, and also in the case where a hydrocarbon fluid is subject to heating by its environment, a platinum outermost layer on the hydrocarbon-wetted surface radiates less energy to the hydrocarbon fluid, further reducing hydrocarbon fluid temperature rise and deposition rates. Fourth, where heat transfer is from a hydrocarbon fluid to a relatively cooler environment, coating only the hydrocarbon-wetted surface of the containment wall increases radiation to the environment and reflects radiation back to the hydrocarbon, thereby reducing wall temperature and deposition rates. In all cases, the barrier layer prevents diffusion of the platinum into the base wall material. The coating system of this invention is capable of performing each of these functions without the disadvantages of volume, weight and cost noted for prior attempts to combine CBC's with low-emissivity coatings.

Other objects and advantages of this invention will be better appreciated from the following detailed description.

DETAILED DESCRIPTION OF THE INVENTION

Figure 1:
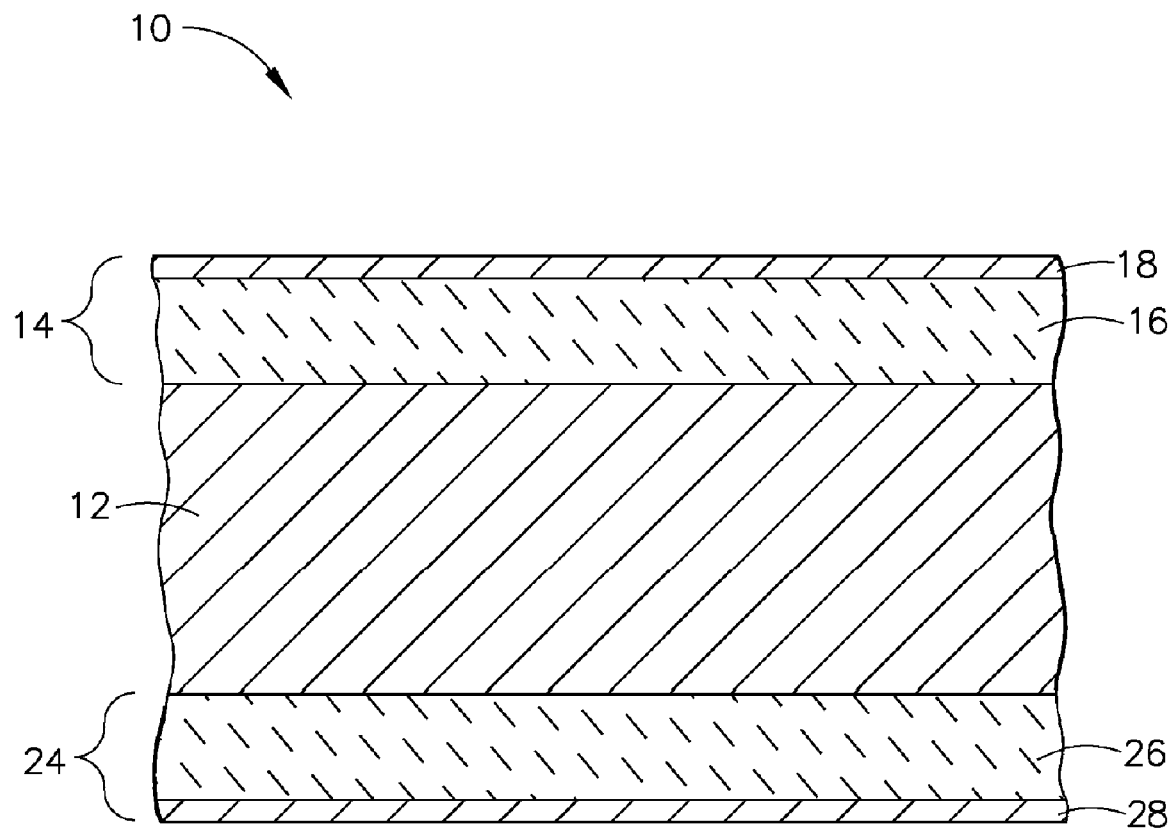
FIG. 1 represents a cross-sectional view of a containment wall having coating systems on a hydrocarbon-wetted surface of the wall and an oppositely-disposed surface of the wall in accordance with a preferred embodiment of this invention.

FIG. 1 represents coating systems 14 and 24 on a component 10 having a containment wall 12 that contacts a hydrocarbon fluid (e.g., fuels and oils) at elevated temperatures. The coating systems 14 and 24 serve to prevent or at least significantly reduce the formation and adhesion of carbonaceous deposits that would otherwise adhere to the wall 12 if maintained at a temperature of up to about 650° F. (about 345° C.). The invention is applicable to any hydrocarbon fluid in which carbonaceous gum (or other polymers) deposits form when the fluid is subjected to elevated temperatures, generally above 140° C. and particular at temperatures of about 220° F. to 650° F. (about 105° C. to 345° C.). Such fluids may be pure hydrocarbon or mixtures thereof. Fluid containment articles that can benefit from the present invention may be any component which is adapted to contain or transport a hydrocarbon fluid through an environment (liquid, gas, or solid) at a different temperature. Notable examples include but are not limited to fuel nozzles, pipes, oil sumps and heat exchangers of gas turbine engines. With each of these examples, the component typically transfers heat from an external heat source to the hydrocarbon fluid within a conduit of the component. It is also possible, though not typical, that heat is transferred from the hydrocarbon fluid to a cooler environment.

In the example represented in FIG. 1, a liquid hydrocarbon fluid (not shown) contacts and flows across a first surface of the wall 12 that is protected by the coating system 14, while a second and preferably identical coating system 24 is present on a second and opposite surface of the wall 12. With this arrangement, heat transfer between the fluid and an external environment surrounding the wall 12 must be conducted through each of the coating systems 14 and 24. Accordingly, the wall 12 is protected by the coating systems 14 and 24 which, in accordance with this invention, reduce or prevent the formation and adhesion of carbonaceous deposits from the fluid that tend to occur as a result of the elevated temperatures of the wall 12 and fluid. The embodiment of FIG. 1 is particularly intended for use where the hydrocarbon fluid is heated by the environment surrounding the conduit through which it flows.

The wall 12 may generally be constructed of any suitable material for the particular application. Typical materials include stainless steel, corrosion-resistant alloys of nickel and chromium, and high-strength nickel-base alloys. Notably, alloys such as these that contain iron, chromium and nickel appear to cause or promote the formation of thermal decomposition products such as gum and coke in liquid hydrocarbon fluids and fuels.

Each coating system 14 and 24 of this invention includes a low-emissivity platinum layer 18 and 28 and a diffusion barrier layer 16 and 26 that separate their respective platinum layers 18 and 28 from the wall 12 of the component 10. Though shown as consisting of only two layers, it is foreseeable that additional coating layers could be employed in one or both of the coating systems 14 and 24. Each coating system 14 and 24 is preferably continuous and completely covers all surfaces of the wall 12 that would otherwise contact, respectively, the fluid within the component 10 or the environment surrounding the component 10.

In accordance with the present invention, the platinum layers 18 and 28 of the coating systems 14 and 24 are smooth and exhibit low emissivity toward, respectively, the hydrocarbon fluid and the surrounding environment. Also according to the invention, the platinum layer 18 on the hydrocarbon-wetted surface of the wall 12 is reactive with hydrocarbon fluids at elevated temperatures. The platinum layers 18 and 28 exhibit sufficiently low emissivity so that, in the embodiment of FIG. 1, radiation heat transfer to the hydrocarbon fluid is reduced as well as radiation heat transfer from a hotter surrounding environment to the fluid. As such, the temperatures of the wall 12 and the fluid, and therefore the tendency for the fluid to form carbonaceous deposits, are reduced. Emissivity values of about 0.2 or less are believed to be suitable for purposes of this invention. To promote a low emissivity, a preferred surface roughness for each of the platinum layers 18 and 28 is about 40 microinches (about 1.0 micrometer) $R_a$ or less. This aspect of the coating systems 14 and 24 also reduces the amount of time that the bulk fluid has to react near the coating surface within the fluid boundary layer, reducing both surface reaction time and concentration of deposit precursors (radicals and atoms) that provide for polymer growth.

According to this invention, hydrocarbon fluid that eventually becomes sufficiently hot to form carbonaceous gum deposits is catalyzed by the platinum layer 18 of the fluid-wetted surface to promote the rapid formation of gum substances. It is believed that the platinum layer 18 catalyzes the formation of carbonaceous gum substances in a hydrocarbon fluid to the extent that, in a flowing system, the gum substances grow too quickly to allow them to adhere to the wall 12. Instead, gum substances are found in the form of very fine particulate within the fluid.

The thicknesses of the platinum layers 18 should generally take into account the growth properties of platinum as it is deposited, as well as the surface roughness of the wall 12. A suitable thickness for the platinum layers 18 and 28 is about 100 to about 500 nanometers, with a more preferred range being about 150 to about 200 nanometers. In a preferred embodiment, the platinum layer 18 continuously covers the surface of the wall 12 to provide the desired chemical and reflective properties throughout the flow system where elevated wall and/or fluid temperatures are likely.

The diffusion barrier layers 16 and 26 prevent interdiffusion between their platinum layers 18 and the article wall 12, which would occur at an unacceptable rate at the temperatures of concern for the invention. The barrier layer 16 also protects the wall 12 from chemical attack from contaminants in the fluid, such as sulfur and water that would form sulfuric acid and pit the surface of the wall 12. Therefore, with the protective barrier layer 16, the coating system 14 prevents or inhibits reactions between constituents of the fluid and wall 12. Preferred materials for the barrier layers 16 and 26 include ceramics such as silica ($SiO_2$) and alumina ($Al_2O_3$), though other ceramics could be used, including yttria ($Y_2O_3$), hafnia ($HfO_2$), tantala ($Ta_2O_5$), mullite ($3Al_2O_3 \cdot 2SiO_2$), and complex chemical combinations of silica with boron and/or phosphorous and/or alumina. As previously noted, the thicknesses of the barrier layers 16 and 26 must be sufficient to prevent interdiffusion with the material of the article wall 12. While optimal thicknesses will depend in part on the composition of the barrier layers 16 and 26, a suitable thickness range is about 500 to about 1500 nanometers, with a more preferred range being about 700 to about 1300 nanometers.

According to this invention, coatings having the above-described characteristics serve to prevent or at least considerably reduce the formation, deposition and adhesion of carbonaceous gum and other decomposition impurities. As evident from the above, a requirement for the low-emissivity coating systems 14 and 24 of this invention is for the barrier and platinum layers 16, 18, 26 and 28 to be deposited in such a manner as to obtain a suitable surface smoothness. According to the invention, a preferred deposition method is chemical vapor deposition (CVD), which is able to deposit the layers 16, 18, 26 and 28 on the surfaces of the wall 12 so that the surface finishes of the coating systems 14 and 24 replicate that of the underlying surfaces of the wall 12. Furthermore, deposition by CVD enables the barrier layers 16 and 26 to be simultaneously deposited on the opposite surfaces of the wall 12, and thereafter the outermost layers 18 and 28 on each of the barrier layers 16 and 26.

In an investigation leading to this invention, a platinum layer was deposited by CVD using platinum acetyl acetone ($Et_2(PtOAc)_2$ as the chemical precursor, and with the following deposition parameters: deposition temperature of about 440° C., deposition pressure of about 500 mtorr, and a duration of about sixty minutes. The resulting platinum layer had a thickness of about 200 nanometers. Prior to depositing the platinum layer, a barrier layer of silica was deposited by CVD at a temperature of about 700° C. and pressure of about 500 mtorr, over a period of about two hours.

Figure 4:
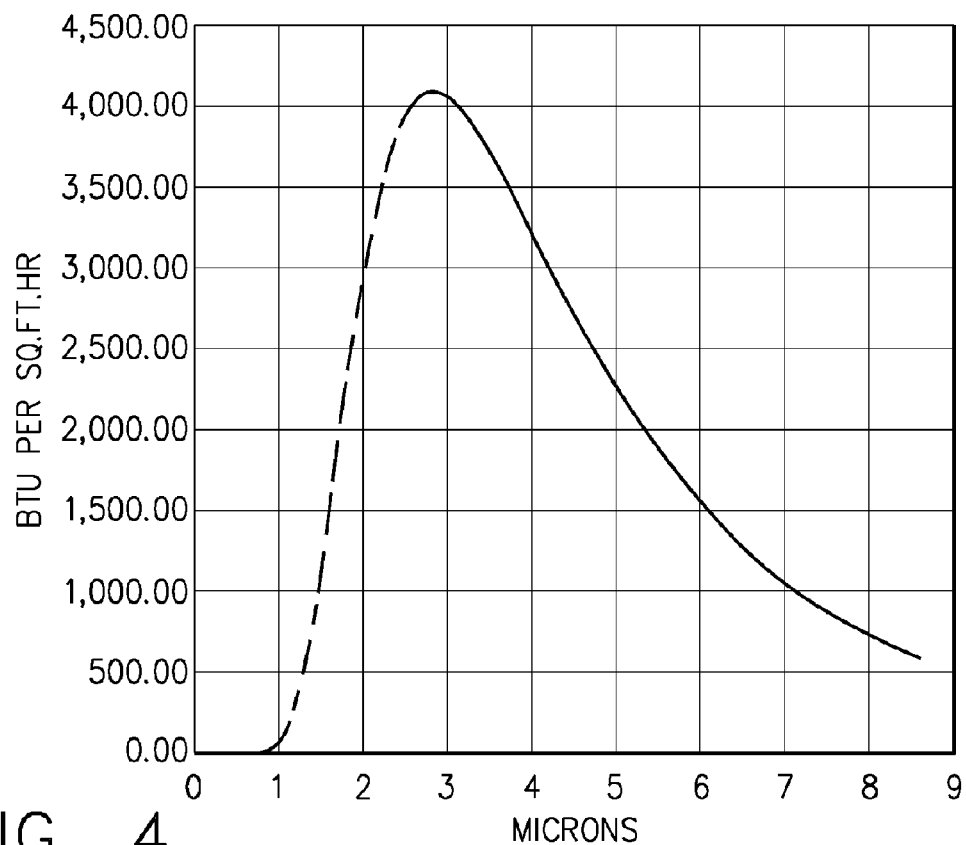
FIG. 4 is a graph representing incident radiant energy for a fuel injector over a wavelength band of 1 to 7 micrometers.
Figure 5:
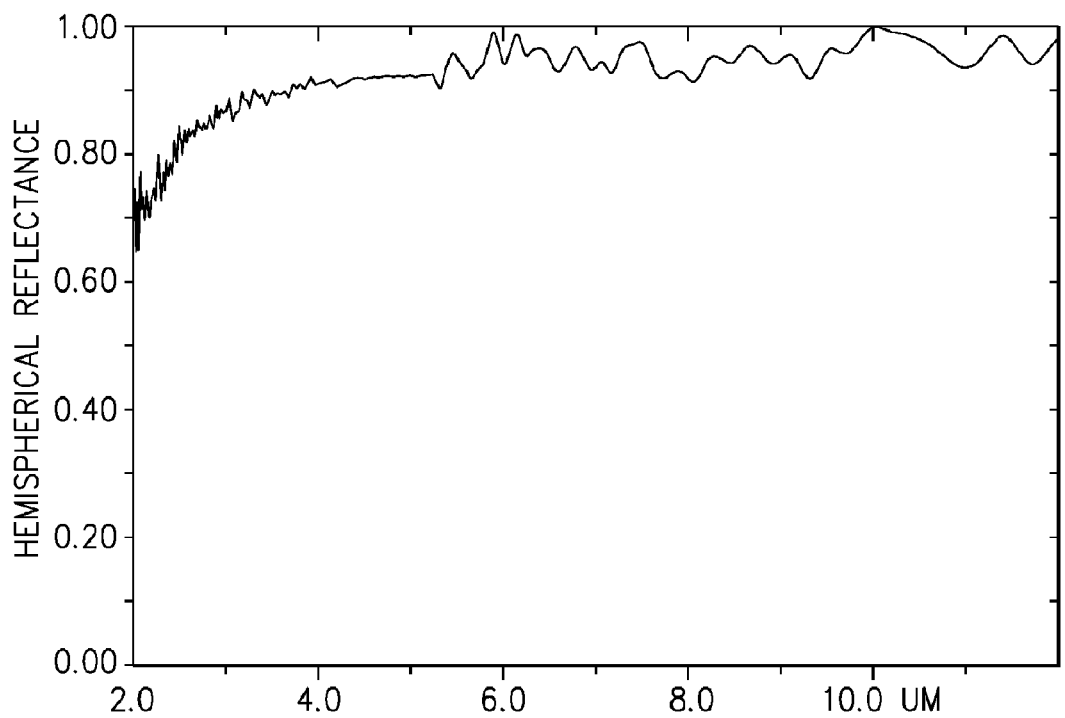
FIG. 5 is a graph showing the reflectance versus wavelength plot for the coating system of FIG. 1 over that portion of the wavelength band shown in FIG. 4 with the highest incident radiant energy.

FIG. 4 is a graph representing incident radiant energy for a fuel injector of a low-emission combustion system. Incident radiant energy is shown as peaking within a wavelength band of about 1 to 7 micrometers. In FIG. 5, the reflectance versus wavelength plot for a coating system in accordance with the embodiment of FIG. 1 is shown over that portion of the wavelength band shown in FIG. 4 with the highest incident radiant energy. FIG. 5 illustrates that the CVD platinum layer of this invention exhibits high reflectivity (low emissivity) over the critical wavelengths of about 2 to 6 micrometers. Accordingly, within the operating environment of the fuel injector, the platinum layers 18 and 28 of this invention are very effective in reducing radiation heat transfer from the surface on which the layer 18 and 28 is deposited to a fluid contacting the layer 18 or an environment to which the layer 28 is exposed.

Figure 2:
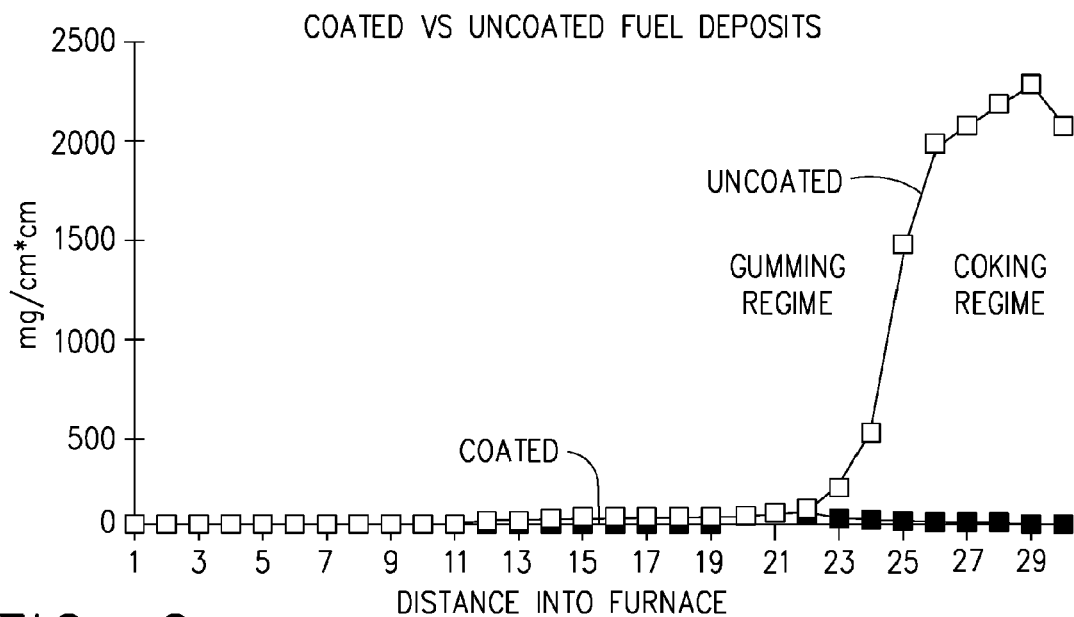
FIGS. 2 and 3 are graphs that illustrate reduced deposition rates achieved with a coating system shown in FIG. 1 as compared to prior art coating systems.

In another investigation leading to this invention, deposition rates were determined for tube specimens formed of Inconel 625, Inconel 718, 321 stainless steel (SS), or 347SS. Jet-A fuel was flowed through these specimens at a pressure of about 500 psi (about 345 bar) and at a flow rate of either about 10 ml/minute for about 150 hours or about 150 ml/minute for about 100 hours. The specimens were placed in a furnace where their external surfaces were heated to a temperature of about 500° C. The fuel was heated by the tube walls of the specimens, so that fuel temperature increased as the fuel flowed further through the length of each tube (the abscissa of FIG. 2). Testing was performed with fifty uncoated specimens and fifty specimens protected by the coating system of this invention. Each coating system included a platinum layer of about 150 nanometers in thickness separated from the internal tube walls by a silica barrier layer having a thickness of about 500 to 600 nanometers. At the completion of the 150 hour test, the amount of carbonaceous deposits was measured for each specimen relative to location along the lengths of the specimens. From FIG. 2, it can be seen that very little deposition occurred on those specimens protected by the coating system of this invention, while uncoated specimens experienced high deposition rates on wall portions of the specimens that sustained fuel temperatures above about 350° C.

A final evaluation was then performed to compare the performance of the coating system of this invention against different coating compositions. Deposition rates were again determined for twenty-five tube specimens formed of Inconel 625, Inconel 718, 321SS or 347SS and under the same conditions as described above. Testing was performed on ten of each of the following specimens.

COATING MATERIALS

Figure 3:
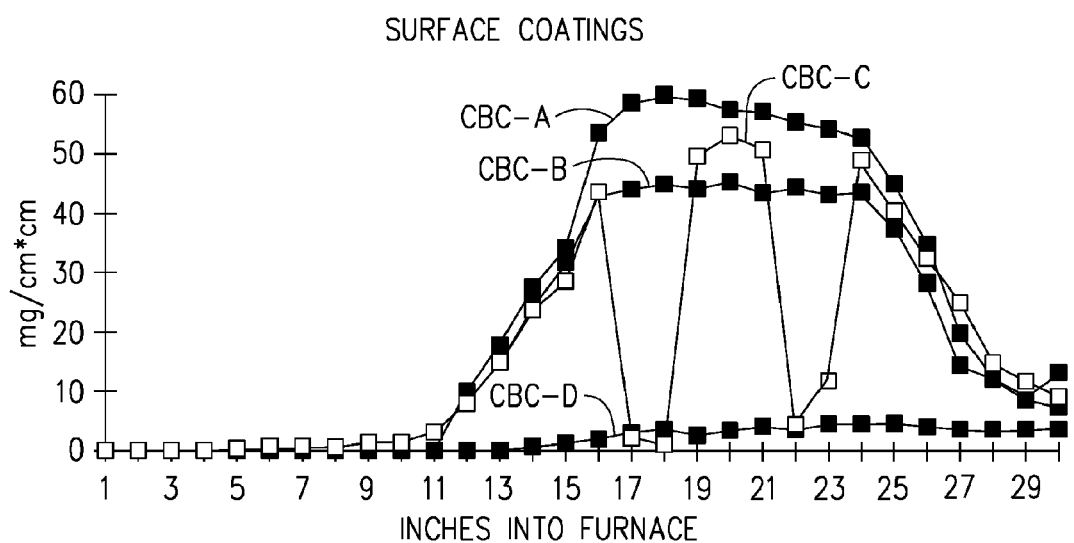

Specimen (Outer/Barrier)
CBC-A CVD tantala/CVD silica
CBC-B CVD silica
CBC-C CVD zirconia/CVD silica
CBC-D CVD platinum/CVD silica Coating thicknesses were about 150 to 200 nm for the outer layers (tantala, zirconia, platinum), and about 700 to 1300 nm for the barrier layers (silica). The total coating thicknesses of the all-silica CBC-B specimens were approximately the same as the coating thicknesses for the other specimens. As with the previous test, at the completion of about 150 hours, the amount of carbonaceous deposits was measured for each specimen relative to location along the lengths of the specimens. From FIG. 3, it can be seen that very little deposition occurred on the specimens protected by the coating system of this invention (CBC-D). In contrast, those specimens coated with the other evaluated coatings experienced significantly higher deposition rates on specimen walls that sustained fuel temperatures of about 250° C. to about 650° C.

While the invention has been described in terms of a preferred embodiment, it is apparent that other forms could be adopted by one skilled in the art. Therefore, the scope of the invention is to be limited only by the following claims.

What is claimed is:

1. A hydrocarbon fluid containment article through which a hydrocarbon fluid flows, the hydrocarbon fluid containment article comprising:
 a wall having a first surface and an oppositely-disposed second surface, each of the first and second surfaces having a surface finish;
 a first coating system on the first surface of the wall and wetted by the hydrocarbon fluid, the first coating system comprising an outermost layer consisting of platinum and a ceramic barrier layer between the outermost layer and the wall, the hydrocarbon fluid contacting and flowing across the outermost layer, the platinum of the outermost layer catalyzing the hydrocarbon fluid to form particulates of carbonaceous gum substances suspended within the hydrocarbon fluid, the ceramic barrier layer being sufficiently thick to inhibit interdiffusion between the outermost layer and the wall; and
 a second coating system on the second surface of the wall and exposed to an environment at a temperature higher than the hydrocarbon fluid, the second coating system comprising an outermost layer of platinum and a ceramic barrier layer between the outermost layer and the wall, the outermost layer being exposed to the environment so as to reflect radiant energy into the environment;
 wherein each of the outermost layers and each of the ceramic barrier layers is deposited by chemical vapor deposition so that the first coating system has a surface finish that replicates the surface finish of the first surface of the wall and the second coating system has a surface finish that replicates the surface finish of the second surface of the wall.

2. The hydrocarbon fluid containment article according to claim 1, wherein the outermost layer of the second coating system has a thickness of about 150 to about 200 nm.

3. The hydrocarbon fluid containment article according to claim 1, wherein the barrier layer of the second coating system has a thickness of about 500 to about 1500 nm.

4. The hydrocarbon fluid containment article according to claim 1, wherein the barrier layer of the second coating system is formed of at least one ceramic material chosen from the group consisting of silica, alumina, tantala, hafnia, yttria, and chemical combinations of silica with boron and/or phosphorous and/or alumina.

5. The hydrocarbon fluid containment article according to claim 1, wherein the hydrocarbon fluid is at a temperature of about 105° C. to about 345° C.

6. The hydrocarbon fluid containment article according to claim 1, wherein the outermost layer of the second coating system consists of platinum.

7. The hydrocarbon fluid containment article according to claim 1, wherein the article is a gas turbine engine component.

8. The hydrocarbon fluid containment article according to claim 1, wherein the article is a gas turbine engine component chosen from the group consisting of fuel/air heat exchangers, pipes, fuel nozzles and oil sumps.

9. The hydrocarbon fluid containment article according to claim 1, wherein the hydrocarbon fluid is a liquid.

10. A gas turbine engine component comprising:
 a wall having a first surface and an oppositely-disposed second surface, each of the first and second surfaces having a surface finish;
 a first coating system on the first surface of the wall and wetted by the hydrocarbon fluid at a temperature of about 105° C. to about 345° C., the first coating system comprising an outermost layer consisting of platinum and a ceramic barrier layer between the outermost layer and the wall, the outermost layer being wetted by the hydrocarbon fluid and inhibiting the formation and adhesion of carbonaceous deposits on the wall by catalyzing the hydrocarbon fluid to form particulates of carbonaceous gum substances suspended within the hydrocarbon fluid, the ceramic barrier layer being sufficiently thick to inhibit interdiffusion between the outermost layer and the wall; and
 a second coating system on the second surface of the wall and exposed to an environment at a temperature higher than the hydrocarbon fluid, the second coating system comprising an outermost layer consisting of platinum and a ceramic barrier layer between the outermost layer and the wall, the outermost layer of the second coating system being exposed to the environment so as to reflect radiant energy into the environment;

wherein each of the outermost layers and each of the ceramic barrier layers is deposited by chemical vapor deposition so that the first coating system has a surface finish that replicates the surface finish of the first surface of the wall and the second coating system has a surface finish that replicates the surface finish of the second surface of the wall.

11. The gas turbine engine component according to claim 10, wherein the outermost layer of each of the first and second coating systems has a thickness of about 150 to about 500 nm.

12. The gas turbine engine component according to claim 10, wherein the outermost layer of each of the first and second coating systems has a thickness of about 150 to about 200 nm.

13. The gas turbine engine component according to claim 10, wherein the barrier layer of each of the first and second coating systems has a thickness of about 500 to about 1500 nm.

14. The gas turbine engine component according to claim 10, wherein the barrier layer of each of the first and second coating systems has a thickness of about 700 to about 1300 nm.

15. The gas turbine engine component according to claim 10, wherein the barrier layer of each of the first and second coating systems is formed of at least one ceramic material chosen from the group consisting of silica and alumina.

16. The gas turbine engine component according to claim 10, wherein the component is chosen from the group consisting of fuel/air heat exchangers, pipes, fuel nozzles and oil sumps.

17. The gas turbine engine component according to claim 10, wherein the outermost layers of each of the first and second coating systems are simultaneously deposited by chemical vapor deposition to have substantially identical thicknesses, and the barrier layer of each of the first and second coating systems are simultaneously deposited by chemical vapor deposition to have substantially identical thicknesses.

18. The gas turbine engine component according to claim 10, wherein the outermost layers have surface roughnesses of not greater than about one micrometer $R_a$.

* * * * *